(12) United States Patent
Libert et al.

(10) Patent No.: US 8,410,847 B2
(45) Date of Patent: Apr. 2, 2013

(54) INPUT COMMON MODE VOLTAGE COMPENSATION CIRCUIT

(75) Inventors: Robert Libert, Rowley, MA (US); Khiem Quang Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 206 days.

(21) Appl. No.: 13/103,292

(22) Filed: May 9, 2011

(65) Prior Publication Data

US 2012/0286859 A1    Nov. 15, 2012

(51) Int. Cl.
*H03F 3/45* (2006.01)

(52) U.S. Cl. ............... 330/69; 330/258; 330/260

(58) Field of Classification Search ............ 330/69, 330/258, 260
See application file for complete search history.

(56) References Cited

U.S. PATENT DOCUMENTS

| | | | | |
|---|---|---|---|---|
| 4,529,947 A * | 7/1985 | Biard et al. | ............ | 330/259 |
| 5,343,160 A * | 8/1994 | Taylor | ............ | 330/9 |
| 6,803,555 B1 * | 10/2004 | Parrish et al. | ............ | 250/214 C |
| 6,819,170 B1 * | 11/2004 | Kindt | ............ | 327/563 |
| 7,433,656 B2 * | 10/2008 | Kappes et al. | ............ | 455/114.2 |
| 7,898,332 B2 * | 3/2011 | Deguchi et al. | ............ | 330/259 |
| 2005/0190003 A1 | 9/2005 | Wu | | |
| 2007/0165347 A1 | 7/2007 | Wendt et al. | | |
| 2010/0315150 A1 | 12/2010 | Ochi | | |

OTHER PUBLICATIONS

PCT International Search Report for PCT/US12/34777 mailed on Aug. 3, 2012.

* cited by examiner

*Primary Examiner* — Patricia Nguyen
(74) *Attorney, Agent, or Firm* — Kenyon & Kenyon LLP

(57) ABSTRACT

A voltage level shifter for a direct coupling of an external voltage source to a common mode of a circuit may include an amplifier, a voltage-controlled current source, a first and second resistors. A first input of the amplifier may be connected to the common mode. A second input of the amplifier may, via the first and second resistors, receive a voltage indicative of the external voltage source. The output of the amplifier may indicate a voltage difference between the first and second inputs. The voltage-controlled current source may be controlled by the voltage difference to supply a current to a common node of the first and second resistors so that the voltage difference between the first and second inputs may be minimized.

18 Claims, 3 Drawing Sheets

INPUT COMMON MODE VOLTAGE COMPENSATION CIRCUIT

FIELD OF THE INVENTION

The present invention is directed to coupling circuits for coupling an external voltage source to a common mode of a circuit. In particular, the present invention is directed to coupling circuits that adaptively compensate the voltage differences between an external voltage source and an internal common mode voltage for direct current (DC) coupling.

BACKGROUND INFORMATION

It is commonly understood that when a first circuit is coupled to a second circuit (or an external circuit) so that signals may be transmitted from the external circuit to the first circuit, a proper coupling circuit is needed to connect the external circuit to the first circuit because the external circuit may have a different DC bias than that of the first circuit. A capacitive coupling circuit is commonly used in signal paths to isolate the first circuit from the external circuit so that the DC bias of the external circuit does not directly affect the operation of the first circuit.

FIG. 1 illustrates a capacitive coupling between two circuits with different DC biases. Referring to FIG. 1, a first circuit 20 and an external circuit 12 are coupled together in signal paths via capacitors 18A, 18B that form a capacitive coupling. The external circuit 12 is supplied with a DC bias $V_{ext}$ 16 that provides a DC operating point for the external circuit 12. Further, the external circuit 12 includes outputs 14A, 14B that output a signal to capacitors 18A, 18B. Circuit 20 may include a differential amplifier 30 that is coupled to capacitors 18A, 18B for receiving the signal from the external circuit 12. The amplifier 30 also includes differential outputs 26A, 26B that provide the signal to other portions of circuit 20. Additionally, the amplifier 30 includes a common mode input 22 that receives a DC bias $V_{com}$ 28 based on which the amplifier 30 operates. Commonly, the DC bias $V_{com}$ 28 on circuit 20 is not leveled with the DC bia $V_{ext}$ 16 for the external circuit 12. Therefore, capacitive coupling circuits such as capacitors 18A, 18B may be used to isolate the external circuit 12 from circuit 20 and to ensure that circuit 20 operates properly without the DC interference from $V_{ext}$ 16.

While a capacitive coupling may help isolate circuit 20 from the DC bias of external circuit 12, the capacitive coupling degraded the low frequency performance of the circuit system. Capacitors 18A, 18B, along with the finite input impedance network in amplifier 30, act as a high-pass filter that removes low frequency components contained in the signal received from the external circuit 12, and thus degrade the low frequency performance for the whole system 10.

To reduce the side effects of degrading low frequency performance, the capacitive coupling is commonly designed to include high-capacitance capacitors. High capacitance means that the physical sizes of capacitors 18A, 18B need to be very large. However, large capacitors may not be realistic in certain applications such as cell phones.

DETAILED DESCRIPTION

Thus, there is a need for coupling circuits that may bridge between circuits without degrading low frequency performance or increasing the size of the coupling circuit. Instead of capacitive coupling, the present invention provides a direct DC-to-DC coupling that adaptively compensates the bias differences between an external circuit and a common mode voltage so as to eliminate the need for capacitive isolators. In this way, the low frequency performance of the circuit system is enhanced without using large capacitors.

Embodiments of the present invention may include a voltage level shifter for a direct coupling of an amplifier including a common mode at a common-mode level. The voltage level shifter may include an amplifier including a first input, a second input, and an output, the first input being coupled to the common mode and the output indicating a voltage difference between the first and second inputs; a voltage-controlled current source having a control input coupled to the output of the amplifier and an output for supplying an output current as a function of a voltage at the control input; a first resistor being coupled between the external voltage source and the output of the voltage-controlled current source; and a second resistor being coupled between the output of the voltage-controlled current source and the second input of the amplifier, in which the output current from the voltage-controlled current source supplies to the second resistor so as to minimize the voltage difference between the first and second inputs of the amplifier.

Figure 1:
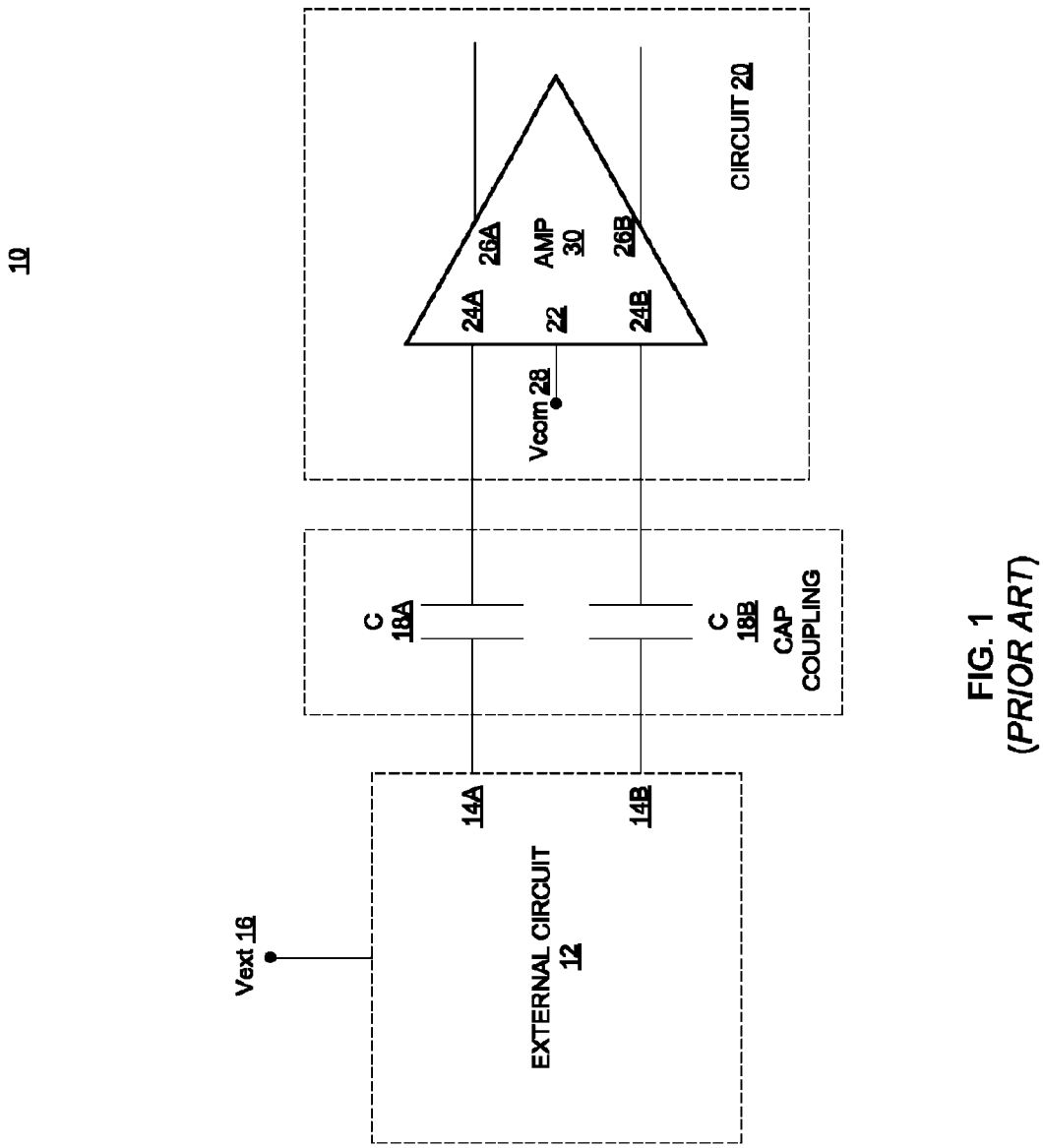
FIG. 1 illustrates an exemplary capacitive coupling between two circuits.
Figure 2:
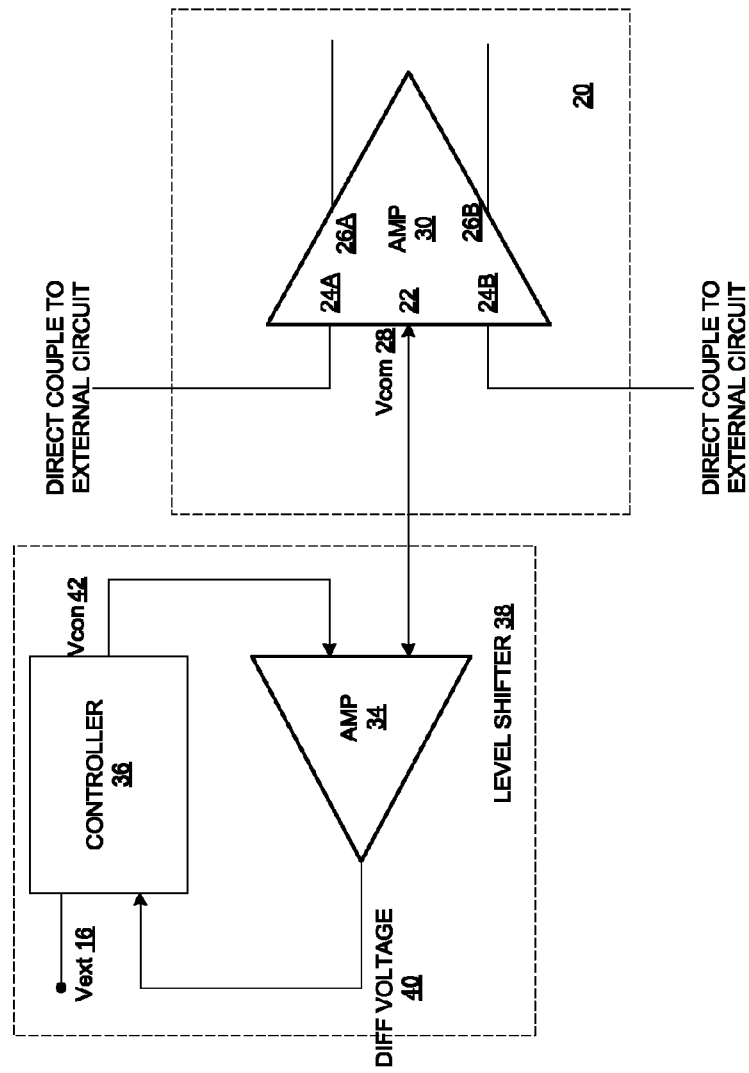
FIG. 2 illustrates a diagram for a DC-to-DC coupling according to an exemplary embodiment of the present invention.

FIG. 2 illustrates a DC-to-DC coupling according to an exemplary embodiment of the present invention. The circuit 20 as illustrated in FIG. 2 may similarly include the same differential amplifier 30 that may directly receive signals at its inputs 24A, 24B from an external circuit (not shown) that has a DC bias $V_{ext}$ 16. The term "directly receive" means that the input signal may be received without a capacitive coupling for isolating direct biases and thus without a high pass filtering process.

A level shifter 38 may bridge the DC bias $V_{ext}$ 16 from the external circuit to the common mode voltage $V_{com}$ 28 of the amplifier 30. The level shifter 38 may include a voltage amplifier 34 and a voltage controller 36. The voltage amplifier 34 may include a first input being coupled to the common mode 22 of the amplifier 30 and a second input being coupled to the an output of the voltage controller 36. The voltage amplifier 34 may also include an output that may be coupled to a first input of the voltage controller 36. A second input of the voltage controller 36 may receive the DC bias $V_{ext}$ 16 for the external circuit.

In operation, the voltage amplifier 34 may compare voltages at the first and second inputs and produce an output of difference voltage 40. Thus, the voltage amplifier 34 may compare $V_{com}$ 28 relating to the external DC bias at the common mode of the amplifier 30 with the output of voltage controller 36 and generate a difference voltage signal 40 between the two inputs. The difference voltage signal 40 from the voltage controller 36 may be fed to the controller 36 where the controller 36 may regulate the DC bias $V_{ext}$ 16 based on the difference voltage signal 40 to generate an output $V_{con}$ 42. In one embodiment, the controller 36 may include a voltage-controlled current source and resistive load devices that may form a negative feedback to the amplifier 34 so that the difference voltage signal 40 is minimized via the negative feedback loop of amplifier 34 and controller 36. Thus, if the difference voltage signal 40 is positive indicating that $V_{con}$ 42 is higher than $V_{com}$ 28, the controller may act to lower $V_{con}$ 42. Conversely, if the difference voltage signal 40 is negative indicating that $V_{con}$ 42 is lower than $W_{com}$ 28, the controller may act to increase $V_{con}$ 42. In this way, the voltage difference between the DC bias $V_{ext}$ 16 and the common mode $V_{com}$ 28 is minimized to 0V or substantially close to 0V, and the external circuit and circuit 20 may be directly coupled without a bias difference or using capacitive coupling.

Figure 3:
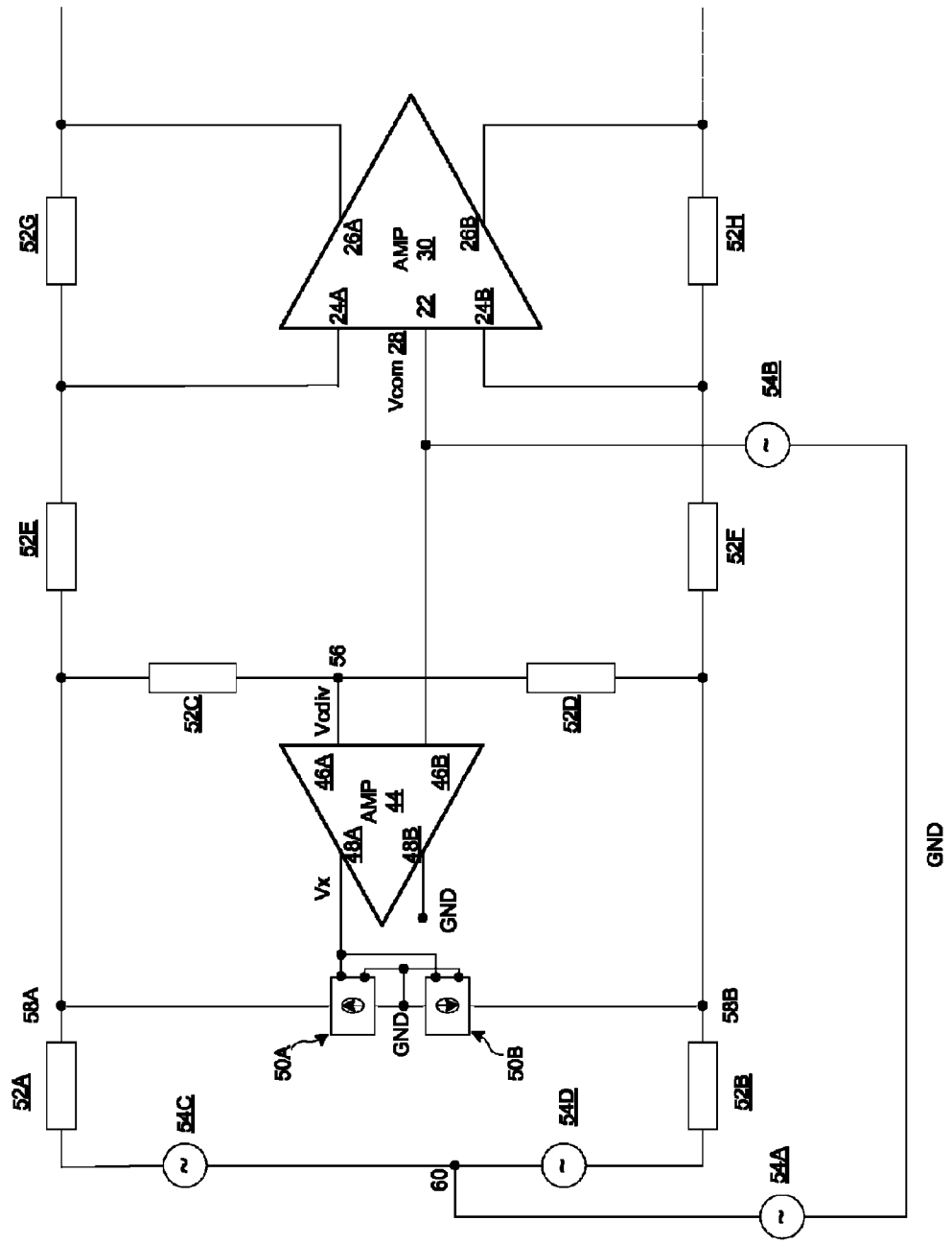
FIG. 3 illustrates a DC-to-DC coupling circuit according to an exemplary embodiment of the present invention.

FIG. 3 illustrates an adaptive DC-to-DC coupling circuit according to an exemplary embodiment of the present invention. In addition to the amplifier 30 as already shown in FIG. 2, the DC-to-DC coupling circuit may include a differential amplifier 44, voltage-controlled current sources 50A, 50B, resistors 52A to 52H, voltage sources 54A, 54B, and current sources 54C, 54D. Amplifier 44 may include differential inputs 46A, 46B and differential outputs 48A, 48B. Thus, the first input 46B may be coupled to the common mode voltage $V_{com}$ 28 of the amplifier 30 and the second input 46A may be coupled to a node 56 at which a voltage signal $V_{cdiv}$ relating to an external bias is measured. Amplifier 44 may act as a voltage comparator for comparing $V_{com}$ at input 46B with $V_{cdiv}$ at input 46A and for outputting a difference voltage signal $V_X$ indicating the voltage difference between $V_{com}$ and $V_{cdiv}$. A first differential output 48B may be coupled to a reference voltage such as the ground. A second differential output 48A ($V_X$) may be coupled to a respective control input for the voltage-controlled current sources 50A, 50B which may be joined at one end to the ground. The voltage-controlled current sources 50A, 50B may each include an output for outputting a current based on the voltage at their respective control inputs. The output currents from the voltage-controlled current sources 50A, 50B may be injected into load resistors 52A to 52D, and the strength of the output currents may be adjusted as a function of the voltage signal at the control inputs. Thus, if the $V_X$ is positive indicating that $V_{cdiv}$ is higher than $V_{com}$, current sources 50A, 50B may inject currents to nodes 58A, 58B where the amount of injected currents may be proportional to the absolute value of $V_X$. Conversely, if the $V_X$ is negative indicating that $V_{cdiv}$ is lower than $V_{com}$, current sources 50A, 50B may withdraw currents from nodes 58A, 58B where the amount of withdrawn currents may be proportional to the absolute value of $V_X$.

To form a negative feedback loop, the overall resistive load may be split into interconnected resistors 52A to 52D. Resistors 52A, 52B may each include a first end that is coupled to current sources 54C, 54D, respectively and a second end that is coupled to nodes 58A, 58B, respectively. Resistors 52C, 52D may each include a first end that is coupled to nodes 58A, 58B, respectively and a second end that is jointly coupled to node 56 or the input 46A of amplifier 44. The outputs of current sources 50A, 50B may be coupled to nodes 58A, 58B, respectively for injecting current to nodes 58A, 58B. Voltage sources 54A, 54B may supply steady voltage references with respect to ground. Voltage source 54B may supply a DC reference voltage of $V_{com}$ 28 to the common mode node 22 of amplifier 30 and input 46b of amplifier 44. Voltage source 54A may supply a DC reference voltage representing an external voltage bias to node 60 based on which current sources 54C, 54D may supply constant currents to resistors 52A, 52B, respectively. Further, resistors 52E, 52F may be coupled between node 58A, 58B, and inputs 24A, 24B of amplifier 30, respectively. Resistors 52G, 52H may be coupled between inputs 24A, 24B and outputs 26A, 26B, respectively. Resistors 52E to 52H are general load resistors for receiving input signals.

In operation, to operate amplifier 30 properly, the common mode 22 of amplifier may be held to a substantially constant voltage of $V_{com}$ 28. Further, the voltage $V_{cdiv}$ at node 60 may be proportional to the external voltage bias measured via resistor pairs of 52A, 52C and 52B, 52D. The resistors 52A to 52D may be calibrated so that the voltage measured at node 56 matches $V_{com}$ 28 during normal operation. Thus, amplifier 44 may compare $V_{com}$ with $V_{cdiv}$ at node 60 to produce a difference voltage output $V_X$ that may be used to control the voltage-controlled current sources 50A, 50B which, depending on the voltage at the control inputs, act as current sources to supply currents to nodes 58A, 58B, or current sinks to withdraw currents from nodes 58A, 58B. In one embodiment, if $V_{cdiv}$ is greater than $V_{com}$, $V_X$ may be a positive difference voltage that may drive the voltage-controlled current sources 50A, 50B to supply currents that are injected into nodes 58A, 58B. Since current sources 54D, 54C supplies constant currents to resistors 52A, 52B, the positive incremental currents supplied from current sources 50A, 50B may increase a voltage drop over resistors 52C, 52D and reduce $V_{cdiv}$ at node 60, thus minimizing $V_X$. Conversely, if $V_{cdiv}$ is less than $V_{com}$, $V_X$ may be a negative difference voltage that may drive the voltage-controlled current sources 50A, 50B to withdraw currents from nodes 58A, 58B. Since current sources 54D, 54C supplies constant currents to resistors 52A, 52B, the negative incremental currents subtracted from current sources 50A, 50B may reduce a voltage drop over resistors 52C, 52D and increase $V_{cdiv}$ at node 60, thus minimizing $V_X$. Thus, the circuit as shown in FIG. 3 may adaptively compensate the voltage difference between an external bias and the common mode voltage. In this way, the circuit may be directly coupled to an external circuit without capacitive coupling.

FIG. 3 is an illustrative and non-limiting exemplary embodiment of the present invention. Other embodiments of the present invention may be similarly constructed. For example, FIG. 3 illustrates a symmetrical differential circuit. However, the present invention may also be constructed in a non-differential circuit.

The present invention may have the advantages of circuit to circuit coupling without using low-pass capacitors, an improved low frequency response, a constant input impedance, and no additional noise sources.

The present invention may be used to serve as an input stage for different circuit systems including analog-to-digital converters.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A voltage level shifter for a direct coupling of a voltage source to an amplifier including a common mode at a common-mode level, comprising:
   an amplifier including a first input, a second input, and an output, the first input being coupled to the common mode and the output indicating a voltage difference between the first and second inputs;
   a voltage-controlled current source having a control input coupled to the output of the amplifier and an output for supplying an output current as a function of a voltage at the control input;

a first resistor being coupled between the external voltage source and the output of the voltage-controlled current source; and a second resistor being coupled between the output of the voltage-controlled current source and the second input of the amplifier, wherein the output current from the voltage-controlled current source supplies to the second resistor so as to minimize the voltage difference between the first and second inputs of the amplifier.

2. The voltage level shifter of claim 1, wherein the common mode sets an operating point for an amplifier.

3. The voltage level shifter of claim 2, wherein the amplifier includes an input that is coupled to an external circuit without a capacitive coupling.

4. The voltage level shifter of claim 1, wherein in response to a first state where a voltage at the first input of the amplifier is larger than a voltage at the second input of the amplifier, the output current from the voltage-controlled current source increases, and in response to a second state where the voltage at the first input of the amplifier is smaller than the voltage at the second input of the amplifier, the output current from the voltage-controlled current source decreases.

5. The voltage level shifter of claim 1, wherein the amplifier is a differential amplifier.

6. A voltage level shifter for a direct coupling of a voltage source to an amplifier including a common mode at a common-mode level, comprising:

an amplifier including a first input, a second input, and an output, the first input being coupled to the common mode and the output indicating a voltage difference between the first and second inputs;

back-to-back connected first and second voltage-controlled current sources each having a control input coupled to the output of the amplifier and an output for supplying an output current as a function of a voltage at the control input;

a first resistor being coupled between the external voltage source and the output of the first voltage-controlled current source;

a second resistor being coupled between the output of the first voltage-controlled current source and the second input of the amplifier;

a third resistor being coupled between the external voltage source and the output of the second voltage-controlled current source; and a fourth resistor being coupled between the output of the second voltage-controlled current source and the second input of the amplifier, wherein the output currents from the first and second voltage-controlled current sources supply to the second and fourth resistors, respectively, so as to minimize the voltage difference between the first and second inputs of the amplifier.

7. The voltage level shifter of claim 6, wherein the common mode sets an operating point for an amplifier.

8. The voltage level shifter of claim 7, wherein the amplifier includes an input that is coupled to an external circuit without a capacitive coupling.

9. The voltage level shifter of claim 6, wherein in response to a first state where a voltage at the first input of the amplifier is larger than a voltage at the second input of the amplifier, the output currents from the first and second voltage-controlled current sources respectively increase, and in response to a second state where the voltage at the first input of the amplifier is smaller than the voltage at the second input of the amplifier, the output currents from the first and second voltage-controlled current sources respectively decrease.

10. The voltage level shifter of claim 9, wherein the amplifier is a differential amplifier.

11. An analog-to-digital converter (ADC), comprising:

a voltage level shifter for directly coupling an external voltage source to an amplifier including a common mode at a common-mode level, wherein the voltage level shifter includes:

an amplifier including a first input, a second input, and an output, the first input being coupled to the common mode and the output indicating a voltage difference between the first and second inputs;

a voltage-controlled current source having a control input coupled to the output of the amplifier and an output for supplying an output current as a function of a voltage at the control input;

a first resistor being coupled between the external voltage source and the output of the voltage-controlled current source; and a second resistor being coupled between the output of the voltage-controlled current source and the second input of the amplifier, wherein the output current from the voltage-controlled current source supplies to the second resistor so as to minimize the voltage difference between the first and second inputs of the amplifier.

12. The ADC of claim 11, wherein the common mode sets an operating point for an amplifier.

13. The ADC of claim 12, wherein the amplifier includes an input that is coupled to an external circuit without a capacitive coupling.

14. The ADC of claim 11, wherein in response to a first state where a voltage at the first input of the amplifier is larger than a voltage at the second input of the amplifier, the output current from the voltage-controlled current source increases, and in response to a second state where the voltage at the first input of the amplifier is smaller than the voltage at the second input of the amplifier, the output current from the voltage-controlled current source decreases.

15. The ADC of claim 14, wherein the amplifier is a differential amplifier.

16. A circuit for directly coupling an external voltage bias to a common mode of a circuit, comprising:

a voltage amplifier circuit including a first input for receiving a first input voltage, a second input for receiving a second input voltage, and an output for outputting a voltage difference between the first and second input voltages; and a controller including a first input being coupled to the output of the voltage amplifier, a second input being coupled to the external voltage bias, and an output, wherein the first input of the voltage amplifier is coupled to the common mode, and the second input of the voltage amplifier is coupled to the output of the controller, the controller is configured to adjust a voltage at the output of the controller from the external bias based on the voltage difference and to minimize the voltage difference.

17. The circuit of claim 16, wherein the controller includes a voltage-controlled current source and at least one resistor.

18. The circuit of claim 17, wherein in response to a first state where a voltage at the first input of the amplifier is larger than a voltage at the second input of the amplifier, the output current from the voltage-controlled current source increases, and in response to a second state where the voltage at the first input of the amplifier is smaller than the voltage at the second input of the amplifier, the output current from the voltage-controlled current source decreases.

* * * * *